United States Patent [19]

Larson et al.

[11] Patent Number: 4,937,469

[45] Date of Patent: Jun. 26, 1990

[54] SWITCHED CURRENT MODE DRIVER IN CMOS WITH SHORT CIRCUIT PROTECTION

[75] Inventors: Tony R. Larson; Larry L. Tretter, both of Tucson, Ariz.

[73] Assignee: International Business Machines Corporation, Armonk, N.Y.

[21] Appl. No.: 238,090

[22] Filed: Aug. 30, 1988

[51] Int. Cl.[5] .................. H03K 3/01; H03K 3/353; H03K 17/16

[52] U.S. Cl. ................................. 307/270; 307/443; 307/448; 307/304; 307/296.6; 330/288

[58] Field of Search ............... 307/443, 448, 304, 270, 307/296.6; 330/288

[56] References Cited

U.S. PATENT DOCUMENTS

| | | | |
|---|---|---|---|
| 4,560,920 | 12/1985 | Okanobu | 330/288 |
| 4,694,201 | 9/1987 | Jason | 307/443 |
| 4,712,023 | 12/1987 | Otsuki et al. | 307/443 |

Primary Examiner—Andrew J. James
Assistant Examiner—Margaret Rose Wambach
Attorney, Agent, or Firm—John H. Holcombe

[57] ABSTRACT

An improved MOS switched current mode drive circuit designed for use in systems interfacing multiple peripheral devices with one or more CPU units attached to a 360/370 channel.

2 Claims, 2 Drawing Sheets

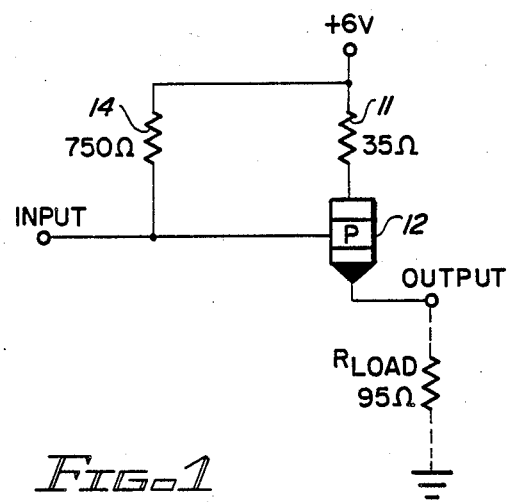
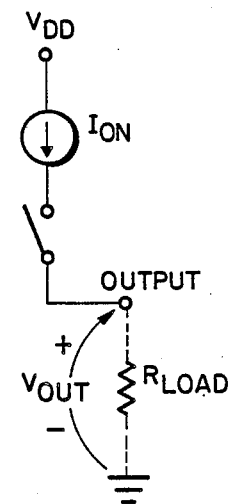
FIG-1 (PRIOR ART)
FIG-2a
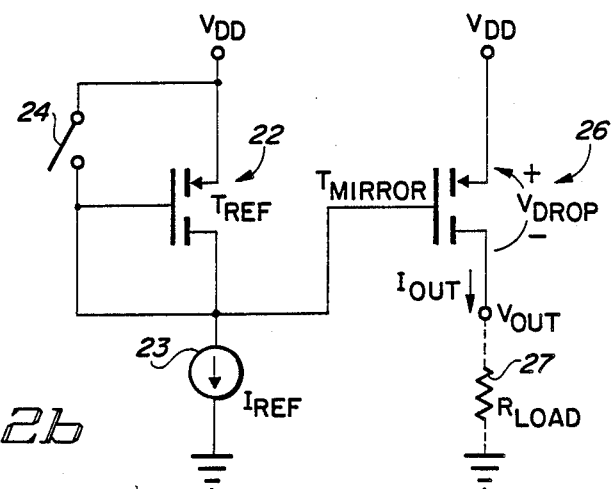
FIG-2b
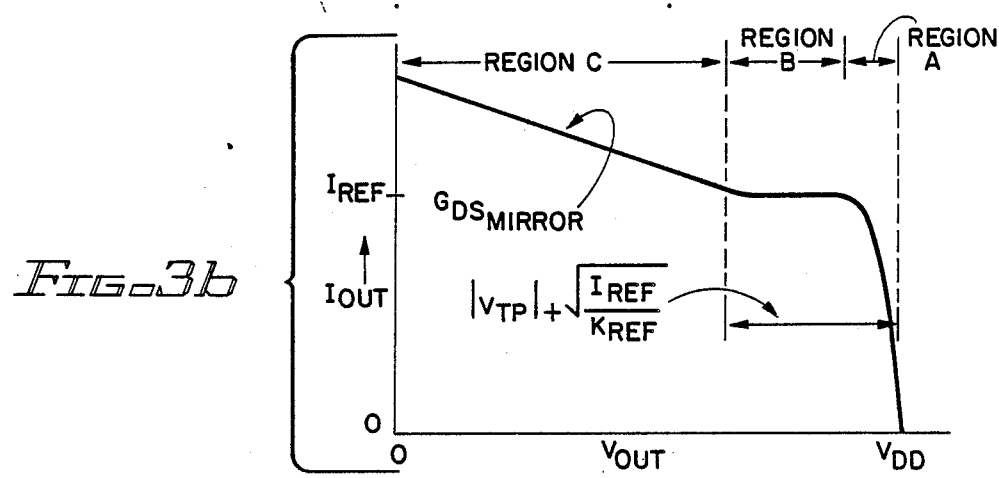
FIG-3b

SWITCHED CURRENT MODE DRIVER IN CMOS WITH SHORT CIRCUIT PROTECTION

BACKGROUND OF THE INVENTION

1. Field of the Invention

The present invention relates to an improved MOS driver circuit for computer applications. More particularly the invention concerns a switched current mode driver designed for use in input-output channel selection functions associated with a 360/370 channel, capable of interconnection with multiple peripheral devices for receiving selection signals from the channel and redriving the signals to the next control unit.

2. Description of the Related Art

In the use of 360/370 channel systems where multiple peripheral devices must be interfaced with one or more CPU's it is common to use a control unit associated with each peripheral device being attached to the 360/370 channel. Such control units use a module that performs power supply, logic and switching functions with respect to the interface lines that are required to initiate and terminate operations between the 360/370 channel interface and the respective control units. In such systems it is usual to provide an integrated select-out bypass chip that performs select-out and select-in control for a single IBM system 360 and system 370 I/O interface. The control unit attached to the 360/370 channel interface uses a select-out signal to detect the start of a selection sequence from the channel. Unlike the other interface lines, the select-out signal is not only received by each control unit, but passes through logic and is redriven to the next control unit attached to the channel. The integrated select-out bypass function provides an electrical bypass for the select-out/select-in signal when the control unit is powered off. Besides the select out bypass function, the internal select-out bypass design contains the driver and receiver used when the control unit is powered up to receive and redrive the select-out signal to the next control unit.

Driver requirements for use in IBM 360/370 channels to drive the select-in and select-out lines require capability to drive 3.9 volts into a 95-ohm cable and be short circuit protected. Modern systems also require short circuit detection (RAS) and a high impedance mode for testing purposes. Bipolar driver circuits have been used in the past in typical line driver implementations. However the usual 6-volt power supply requirement for bipolar circuits is undesirable. Moreover, the large current limiting resistors associated with such circuits result in excessive power dissipation. Consequently, a need exists to utilize MOS circuitry for such line driver implementations in order to operate at the lower power supply voltages, typically 5 volts, available with more recently designed systems, and to reduce power dissipation.

SUMMARY OF THE INVENTION

These needs are met by the present invention which comprises an improved MOS line driver circuit capable of operation in a switched current mode. The preferred embodiment is achieved in a current mirror configuration. The resulting circuit operates easily with a 5-volt, ±10% supply, which is available in all such systems, using about one-fifth the power which is dissipated by previously used bipolar circuits.

The foregoing and other objects, features, and advantages of the invention will be apparent from the following more particular description of preferred embodiments of the invention, as illustrated in the accompanying drawings.

BRIEF DESCRIPTION OF THE DRAWINGS

These and other features of the invention are illustrated in the accompanying drawings wherein:

FIG. 1 represents a typical prior art non current mode line driver designed in bipolar technology.

FIG. 2a represents a switched current mode driver.

FIG. 2b represents an MOS realization of a switched current mode driver.

FIG. 3b is a graph of the electrical output characteristics of the circuit of FIG. 3a.

FIG. 4b is an improved driver circuit similar to that illustrated in FIG. 4a.

DETAILED DESCRIPTION

Figure 3A:
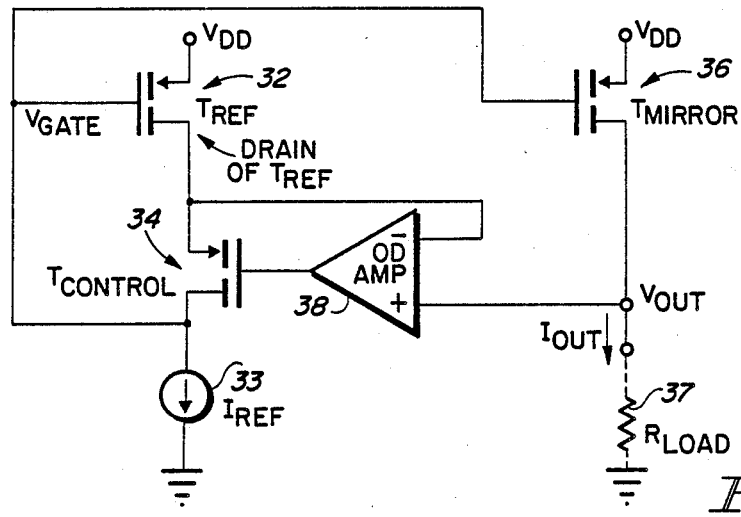
FIG. 3a represents an improved output resistance current mirror driver circuit.

FIG. 1 shows a typical prior art line driver implementation. This basic circuit has been used extensively in bipolar versions of I/O drivers of the type generally described herein.

In the circuit illustrated in FIG. 1, a +6-volt supply voltage is provided through a current limiting resistor 11 to the collector of an NPN transistor 12 having its emitter connected to a 95-ohm load resistor at the output. The driver input is connected to the base of the transistor and a 750-ohm resistor 14 is provided between the input and reference voltage terminals.

The configuration may be implemented in MOS technology simply by replacing the NPN device with a MOSFET. However the large current limiting resistor and the 6-volt power supply requirements are very undesirable. Many newer technologies do not allow operation at 6 volts, and systems are less expensive if all circuits use a single power supply, typically 5 volts with a 10% tolerance. The 35-ohm current limiting resistor dissipates a significant amount of power, especially when the driver is short circuited. It is often added as an external resistor, increasing both the module pin count and production costs.

A basic Switched Current Mode Driver (SCMD) configuration, shown in FIG. 2a, would partially overcome these problems. When switched on, a current, $I_{ON}$ from a current source, is forced through the load. The voltage developed at the output is then $$V_{OUT} = I_{ON} \times R_{LOAD}.$$

For $I_{ON} > 42.2$ ma and $R_{LOAD} > 92.6$ ohms, the voltage developed exceeds the required 3.9 volts. When the SCMD is switched off, the load pulls the line to a logic zero level as does the classic driver of FIG. 1.

The power dissipated by a SCMD under short circuit conditions is only $$Power = I_{ON} \times V_{DD}.$$

For $I_{ON} = 42$ ma and $V_{DD} = 5.0$ volts, the power is 0.21 Watts. Under similar conditions, the circuit of FIG. 1, dissipates $$Power = V_{DD}^2 / 35 = 1.02 \text{ Watts}$$

Thus, the SCMD dissipates about one-fifth the power of a conventional bipolar driver under short circuit conditions. The SCMD requires no complicated protection circuit to shut it down during shorts. Unlike many other drivers, the SCMD returns to normal operation as soon as a short is removed, without requiring a reactivation sequence such as cycling its input.

A SCMD may be realized as a current mirror and a switch. FIG. 2b shows such a driver configuration implemented in MOS technology. In FIG. 2b, the switched current mode driver utilizes a supply voltage $V_{DD}$ connected to the source of a P channel reference device 22, having its gate and drain connected to a current reference 23 and a switch 24. A current mirror, typically another P channel device 26 is provided, again having its source connected to $V_{DD}$, its gate connected to the drain of device 22, and its drain connected to an output or load impedance 27.

When the switch 24 is open, the reference current flows through device 22 and is mirrored in device 26 forcing the output high. When the switch 24 is closed, it bypasses device 22 so no current is reflected in device 26. With no current in device 26, the load resistor 27 pulls the output low. Choice of appropriate device sizes for device 22 and device 26 allows them to remain saturated while the source to drain voltage of device 26 is made arbitrarily small. Theoretically any supply voltage greater than the required output voltage across resistor 27 is sufficient to power the circuit. This allows the switched current mode driver to operate from a typical 5-volt, 10% supply and meet the 3.9-volt logic one level.

The precision of current mirrors in any integrated circuit technology can be high due to good tracking of parameters across carefully designed devices. It depends primarily on parameter matching rather than on the absolute values. MOS technology is especially well suited for current mirror designs because of extremely low gate current. The only parameter of concern, not canceled by tracking, is the output conductance, $G_{DS}$. $G_{DS}$ may, however, be reduced to an arbitrarily small value by device design. Therefore, the theoretical accuracy of a SCMD in MOS is limited only by the accuracy of the reference current and the degree of matching of the devices.

In MOS technology, the output impedance of a SCMD is increased as device lengths are increased. Unfortunately, area and capacitance considerations limit the length that may be used in practice. Current errors may be eliminated, even in short devices, by forcing all nodes of the mirroring devices to the same potential. This is commonly done by "stacking" mirror devices. Stacked mirrors, however, require higher power supply voltages to bias the additional devices. Thus, prior art stacked mirrors only improve the output impedance when the output potential is significantly lower than $V_{DD}$ and it has been found that the 3.9-volt requirement of the typical SCMD cannot be met with this type of current mirror. A solution to the problem is to add a feedback circuit that controls the drain of the reference device, as illustrated in FIG. 3a. In FIG. 3a a current mirror circuit is illustrated wherein device 32 serves as a reference, device 34 is a control element and device 36 is the mirror element. As shown, all devices are P channel MOSFETS. $V_{DD}$ is connected to the source of device 32, and its drain is connected to the source of device 34. The drain of device 34 is connected to the current reference 33, and to the gate of device 32.

The gate of device 32 is also connected to the gate of device 36, with the source of device 36 being connected to $V_{DD}$ and its drain being connected to load impedance 37, as illustrated. The circuit otherwise includes a conventional operational amplifier 38 having its output connected to the gate of device 34. An inverting input of the OP AMP is connected to the drain of device 32 and the non inverting input is connected to the drain of mirror device 36.

The gates as well as the sources of the two mirroring devices (32 and 36) are tied together, forcing their $V_{GS}$ potentials to track each other. The OP AMP 38 and device 34 force the drain of device 32 to follow the potential at $V_{OUT}$ which is also the drain voltage of device 36. Therefore the gates, sources, and drains of the two mirroring devices 32 and 36 are at the same potential. $V_{GATE}$ must adjust itself so that the reference current flows through device 32. Since device 36 sees the same terminal voltages as device 32 does, it mirrors the reference current "perfectly", whether or not the devices are operating in saturation. As $V_{OUT}$ approaches $V_{DD}$, the source to drain voltage of the mirroring devices becomes very small, forcing the devices out of saturation and into the linear region. The mirror continues to operate with the devices in the linear region by lowering the potential at the gates of devices 32 and 36 which, in turn, increases the gate drive of the mirroring devices, thereby maintaining constant current. This range of ideal operation is shown in FIG. 3b as region "B".

If device 33 were an ideal current source, $V_{GATE}$ would continue dropping as $V_{OUT}$ was brought arbitrarily close to $V_{DD}$. There is, of course, a limit to how low $V_{GATE}$ can drop and still sustain current through the non-ideal device 33 current source. When this limit, typically 1 volt, is reached, a further increase in $V_{OUT}$ will not produce a corresponding drop in $V_{GATES}$. Instead, the reference current begins to decrease, which in turn decreases the mirrored output current, $I_{OUT}$. This is shown as region "A" in FIG. 3b and can be made arbitrarily small by making device 33 a more perfect current source (e.g. connect it to a negative power supply instead of ground). Even without a perfect $I_{REF}$ source, this improved mirror allows operation much closer to the $V_{DD}$ rail than the other circuits.

Device 34 cannot force the drain of device 32 to drop below the potential of $V_{GATE}$. If $V_{OUT}$ falls below $V_{GATE}$ the feed back circuit effectively shorts the gates of the mirroring devices to the drain of device 32 through device 34. This mode of operation is shown as region "C" in FIG. 3b. The characteristics of the mirror in this region are nearly identical to those of a simple mirror built with equivalent device sizes.

The normal mode of operation for this improved current mirror, when implementing a SCMD is in region "B". Because the near ideal characteristics of region "B" extend very close to $V_{DD}$ and allow devices to operate in the linear region, lower power supply voltages and much smaller devices may be used in this configuration than in previous configurations.

Figure 4A:
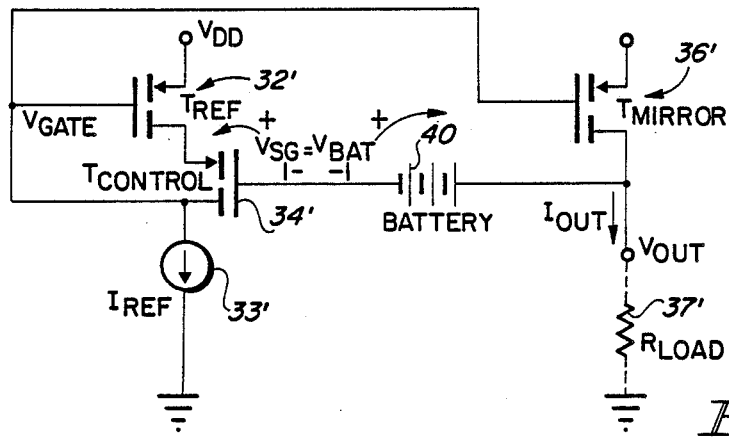
FIG. 4a is a schematic of an improved current mirror driver circuit.
Figure 4B:
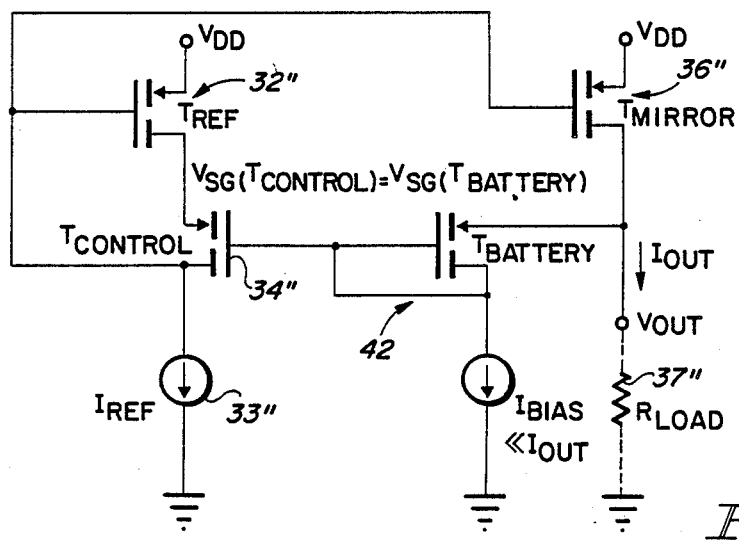

A "battery" that drops the same voltage as the gate to source voltage, $V_{GS}$ of device 34 may replace the operational amplifier of FIG. 3a as shown in FIG. 4a where like elements are represented by like primed numerals. This "battery" is easily implemented as a scaled device biased by a small constant current source as shown in FIG. 4b. As long as the $V_{GS}$ voltage of device 42 is equal to that of device 34'', the mirror devices 32'' and 36" will see the same potential at all nodes and the circuit will behave just like the one in FIG. 3a. The advantages of this circuit are its smaller area, reduced complexity and wider bandwidth due to the removal of the operational amplifier.

While the invention has been particularly shown and described with reference to preferred embodiments thereof, it will be understood by those skilled in the art that various changes in form and details may be made therein without departing from the spirit and scope of the invention.

What is claimed is:

1. A switched current mode driver circuit for being electrically connected to a load means comprising:

an MOS reference transistor and an MOS control transistor connected between a reference voltage source and a current source, each of the MOS transistors having a source drain and a control terminal, the source terminal of the MOS control transistor being electrically connected to the drain terminal of the MOS reference transistor, the source terminal of the MOS reference transistor being electrically connected to the voltage source, the drain terminal of the MOS control transistor being electrically connected to said current source;

an MOS mirror transistor having source, drain and control terminals and being connected between the reference voltage source and the load means in mirrored configuration to the reference transistor; and signal means connected to the control transistor control terminal and the mirror transistor control terminal for controlling drain potential of the reference transistor and including operational amplifier means having an input to the drain terminal of the mirror transistor and having another input electrically connected to terminal of the referenced transistor and on output connected to the control terminal of the control transistor whereby it follows drain potential of the mirror transistor.

2. The switched mode driver circuit of claim 1, wherein the signal means comprises another MOS transistor having a source terminal connected to the drain terminal of the mirror transistor and a gate terminal and a drain terminal connected to the control terminal of the control transistor.

* * * * *